(12) United States Patent
Kasumi

(10) Patent No.: US 8,347,915 B2
(45) Date of Patent: Jan. 8, 2013

(54) LOAD-LOCK TECHNIQUE

(75) Inventor: Kazuyuki Kasumi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 1094 days.

(21) Appl. No.: 11/843,074

(22) Filed: Aug. 22, 2007

(65) Prior Publication Data

US 2008/0003081 A1    Jan. 3, 2008

Related U.S. Application Data

(62) Division of application No. 10/994,360, filed on Nov. 23, 2004, now abandoned.

(30) Foreign Application Priority Data

Nov. 25, 2003   (JP) .................................. 2003-393670

(51) Int. Cl.
   *G05D 7/00*   (2006.01)
(52) U.S. Cl. ........ 137/613; 414/217; 414/804; 414/805; 414/939; 438/14
(58) Field of Classification Search .................. 414/804, 414/805, 217, 939; 137/613; 438/14
   See application file for complete search history.

(56) References Cited

U.S. PATENT DOCUMENTS

| | | | |
|---|---|---|---|
| 4,184,448 A | 1/1980 | Aichert et al. ................. | 118/729 |
| 5,112,277 A | 5/1992 | Cruz et al. ..................... | 454/195 |
| 5,363,872 A | 11/1994 | Lorimer ........................... | 137/1 |
| 5,455,082 A | 10/1995 | Saito et al. ..................... | 427/452 |
| 5,572,563 A | 11/1996 | Kasumi et al. ................. | 378/34 |
| 5,835,560 A | 11/1998 | Amemiya et al. .............. | 378/34 |
| 6,048,154 A | 4/2000 | Wytman ......................... | 414/217 |
| 6,558,509 B2 | 5/2003 | Kraus et al. .............. | 156/345.54 |
| 6,714,277 B2 | 3/2004 | Hara et al. ....................... | 355/30 |
| 6,754,303 B2 | 6/2004 | Kasumi ........................... | 378/34 |
| 6,841,200 B2 | 1/2005 | Kraus et al. .................... | 427/452 |
| 6,916,009 B2 | 7/2005 | Blecha .......................... | 251/158 |
| 2002/0005168 A1 | 1/2002 | Kraus et al. .................... | 118/715 |
| 2004/0004701 A1 | 1/2004 | Kasumi ........................... | 355/53 |
| 2004/0257550 A1 | 12/2004 | Kasumi ........................... | 355/53 |
| 2005/0118002 A1 | 6/2005 | Kasumi ........................... | 414/221 |

FOREIGN PATENT DOCUMENTS

JP    2001-102281    4/2001

*Primary Examiner* — Scott Lowe

(74) *Attorney, Agent, or Firm* — Fitzpatrick, Cella, Harper & Scinto

(57) ABSTRACT

A method of exhausting a gas in a chamber of a load-lock system having a first valve defining an opening for supplying a gas and a second valve defining an opening for conveyance of an article. The method includes a gas supplying step for supplying a gas heated by a heater into the chamber through the first valve, while the first valve and the second valve are kept open, a conveying step for conveying the article into the chamber while the second valve is kept open, and an exhausting step to be carried out after the gas supplying step and the conveying step are executed and the first and second valves are closed, to exhaust the gas inside the chamber while the first valve and the second valve are kept closed.

5 Claims, 13 Drawing Sheets

LOAD-LOCK TECHNIQUE

This application is a divisional application of U.S. patent application Ser. No. 10/994,360, filed Nov. 23, 2004.

FIELD OF THE INVENTION AND RELATED ART

This invention relates to a load-lock technique applicable to the production of various microdevices such as, for example, semiconductor chips (e.g., ICs or LSIs), display devices (e.g., liquid crystal panels), detecting elements (e.g., magnetic heads), and image pickup devices (e.g., CCDs).

The density and speed of a semiconductor integrated circuit have been improved significantly and, with this trend, the linewidth of an integrated circuit pattern has been narrowed more and more. This forces further improvements in the semiconductor manufacturing method. With regard to exposure apparatuses used for forming a resist pattern in a lithographic process, which is in one of semiconductor manufacturing processes, those using vacuum ultraviolet light (VUV light), such as KrF laser light (wavelength 248 nm), ArF laser light (wavelength 193 nm) or $F_2$ laser light (wavelength 157 nm) have been developed. Currently, EUV exposure apparatuses, which use extreme ultraviolet light (EUV light) having a wavelength of about 10 nm, are being developed. Exposure apparatuses using an electron beam are being developed, on the other hand.

If the wavelength is short, such as EUV light, X-rays or an electron beam, the exposure light is attenuated in the atmosphere. In consideration of this, to avoid attenuation of exposure light, the exposure process is carried out in a vacuum ambience or a reduced pressure He ambience.

In process machines, such as sputtering apparatus, carrying out a process in a vacuum ambience is common. Loading and unloading a substrate to be processed, from the atmosphere into a process chamber (vacuum ambience), is carried out by way of a load-lock chamber (housing).

In exposure apparatuses as well, load-lock chambers are used when a substrate to be exposed is loaded into a vacuum ambience (exposure ambience).

Referring now to FIG. 5, the structure of a known type of load-lock system will be explained. Load-lock chamber (housing) 101 is provided at a side of a main chamber 102 in which an exposure process is to be carried out. There is an atmosphere side gate valve 104 at one side of the load-lock chamber 101, and a vacuum side gate valve 103 at the other side of the load-lock chamber. For evacuation to create a vacuum level in the chamber, there are an exhaust pipe 105, an exhaust valve 106 and a vacuum pump 107. Furthermore, for resuming an atmospheric pressure inside the chamber from the vacuum level, there are a gas supply pipe 108 and a gas supplying valve 109.

For loading a substrate 110 into the main chamber 102, which is in a vacuum state, the vacuum side gate valve 103, the exhaust valve 106 and the gas supply valve 109 are kept closed and, on the other hand, the atmosphere side gate valve 104 is opened. Then, the substrate 110 is introduced into the load-lock chamber 101. Subsequently, the atmosphere side gate valve 104 is closed, and the exhaust valve 106 is opened. Normally, the vacuum pump 107 is kept driven uninterruptedly. With regard to the exhaust valve 106, generally, a butterfly valve is used. By opening the exhaust valve 106, the atmospheric gas inside the load-lock chamber 101 is discharged outwardly. After the exhausting is completed, the exhaust valve 106 is closed and the vacuum side gate valve 103 is opened, and the substrate is introduced into the main chamber 102. After the substrate is loaded, the vacuum side gate valve 103 is closed.

For unloading a processed substrate out of the main chamber 102, the load-lock chamber is exhausted and placed in a vacuum state (all the valves and gate valves are kept closed), and thereafter, the vacuum side gate valve 103 is opened. Then, the substrate 110 is unloaded and moved back into the load-lock chamber 110. After this, the vacuum side gate valve 103 is closed and, subsequently, the gas supply valve 109 is opened. The gas supply pipe 108 is communicated with the atmosphere, such that, by opening the gas supply valve 109, the inside of the load-lock chamber 101 can be filled with atmosphere. After an atmospheric pressure is reached, the atmosphere side gate valve 104 is opened, and the substrate 110 is moved outwardly.

With the procedure described above, it is assured that a substrate 110 is conveyed between the atmosphere and the main chamber 102 without damaging the vacuum state inside the main chamber 102.

Japanese Laid-Open Patent Application, Publication No. 2001-102281, discloses an example of a load-lock chamber that can be applied to a semiconductor exposure apparatus, or the like.

However, in the load-lock chamber structure such as described above, when the gas is exhausted to create a vacuum level in place of the atmospheric pressure state, at the same moment as the exhaust valve is opened, the atmospheric air inside the chamber is exhausted rapidly. This causes adiabatic expansion of the air and, thus, the temperature decreases suddenly. As a result of this, the moisture content contained in the atmosphere is frozen and adhered to the substrate surface, causing contamination of it. Simultaneously, since heat is carried away from the substrate, the temperature of the substrate is lowered. If the load-lock operation and operations following it are carried out while the substrate temperature is low, the substrate temperature gradually rises in accordance with the surrounding temperature. Such a temperature rise is a serious factor for slowing down the production yield, particularly, in a process (such as a lithographic process) in which precise temperature control is required.

Generally, the inconveniences described above can be avoided by carrying out the vacuum exhausting slowly, to provide sufficient time for transmission of heat between the air and the surrounding ambience. Load-lock systems are incorporated into process machines, such as film forming apparatus and, in such machines, the time required for the process itself is relatively long. Thus, there is a margin with respect to time that can be spent on substrate loading and unloading by load-locking. Even if the vacuum exhausting takes time, it does not affect the throughput of the apparatus.

Among exposure apparatuses, those that are arranged to carry out the exposure process in a vacuum have already been used in practice, such as an electron beam direct drawing apparatus, for example. Such apparatus have a very low throughput by nature, and the time necessary for loading and unloading a substrate by load-locking does not raise a problem. However, EUV exposure apparatuses, and the like, are machines designed for mass production of MPUs or memories, for example, and a very high throughput on an order of one hundred pieces per hour is required. If the load-lock structure is arranged for slow exhausting, although the inconveniences, such as substrate contamination or temperature decrease could be avoided thereby, a very long time is required for substrate loading and unloading. This is a serious factor for throughput decrease of the apparatus. Practically, therefore, the load-lock structure such as described above cannot be applied to a machine, such as an EUV exposure apparatus, in which a large throughput is required.

SUMMARY OF THE INVENTION

It is accordingly an object of the present invention to provide a load-lock technique by which high-speed vacuum exhausting is enabled, while reducing or suppressing contamination or temperature decrease of an object to be loaded and/or unloaded.

In accordance with an aspect of the present invention, there is provided a load-lock system, comprising a chamber, an exhaust system for exhausting a gas from the inside of the chamber, a heater, a first valve for opening/closing an opening of the chamber, a supply system for supplying a gas into the chamber through the heater and the first valve, and a second valve for opening/closing an opening of the chamber provided for conveyance of an object, wherein the supply system supplies a gas before the object is conveyed into the chamber, and when the second valve is held opened, and wherein the exhaust system exhausts a gas supplied from the supply system, after the conveyance of the object.

In accordance with another aspect of the present invention, there is provided a load-lock method, comprising a first step for supplying a gas into a chamber through a heater and a first valve which opens/closes an opening formed in the chamber, a second step for closing the first valve after the first step, a third step for conveying an object into the chamber through a second valve that opens/closes an opening formed in the chamber, a fourth step for closing the second valve after the third step, and a fifth step for exhausting a gas inside the chamber, after the second step and also after the fourth step.

Briefly, in accordance with the present invention, a load-lock technique, by which high-speed vacuum exhausting is enabled, while reducing or suppressing contamination or temperature decrease of an object to be loaded and/or unloaded, can be provided.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings, and in relation to examples, wherein the present invention is applied to an exposure apparatus.

Embodiment 1

Figure 1:
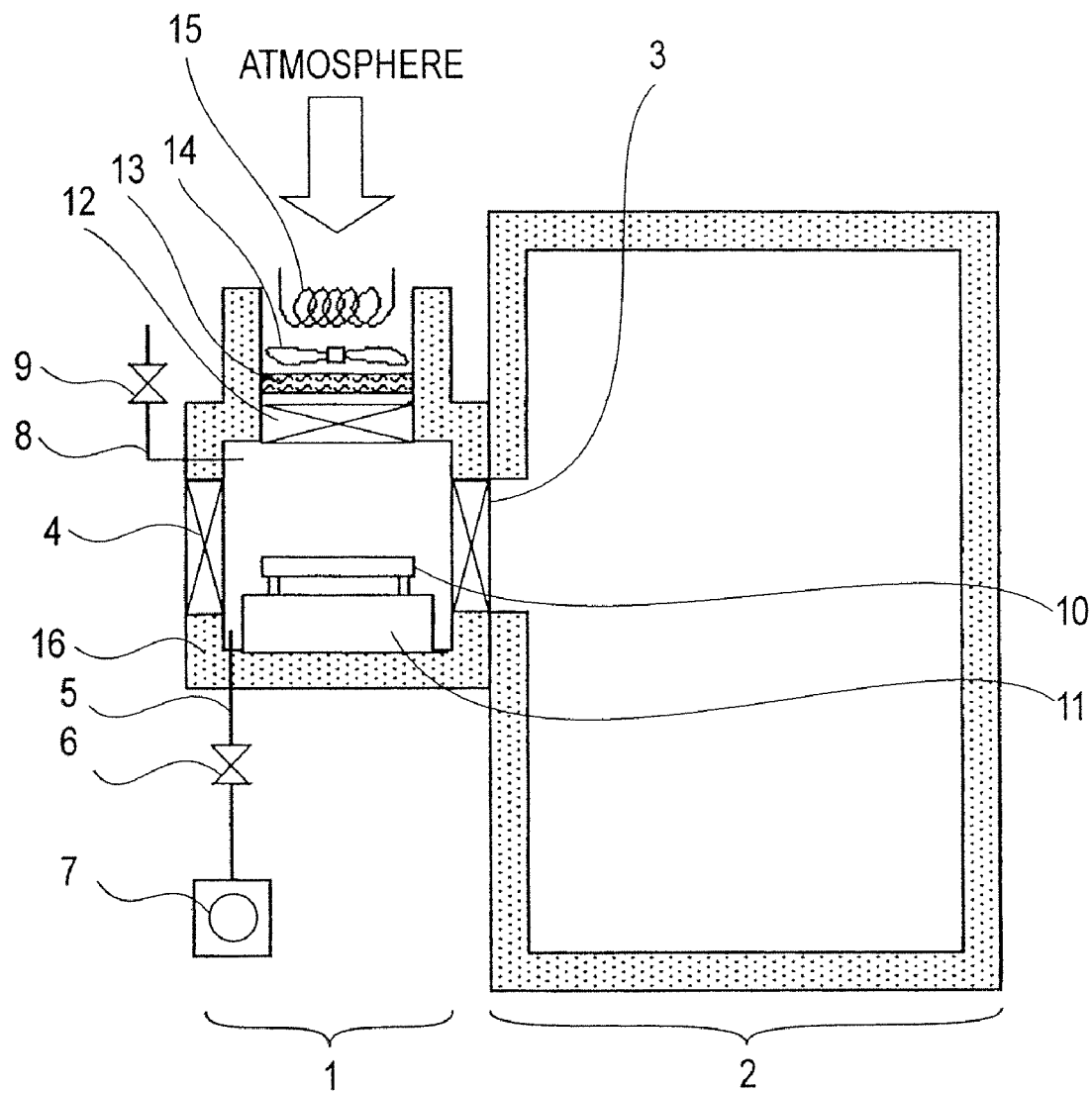
FIG. 1 is a schematic view for explaining a load-lock system according to a first embodiment of the present invention.

FIG. 1 illustrates a load-lock system according to a first embodiment of the present invention. The first embodiment is applied to an EUV (extreme ultraviolet) exposure apparatus wherein exposure is carried out in a vacuum ambience. Denoted at 1 is the load-lock system of the present invention, and denoted at 2 is a main chamber, which is used as an exposure chamber of the exposure apparatus. The main chamber is filled with a vacuum ambience or a particular ambience, such as reduced pressure He, for example. The load-lock chamber 1 serves to enable loading a substrate 10 thereinto from the atmosphere without breaking the vacuum ambience or particular ambience, and also to assure unloading of the substrate 10, after being processed inside the main chamber 2, outwardly.

Basically, the present invention is directed to a load-lock system, and it is not always necessary that the machine placed at the main chamber side of the load-lock system be an exposure apparatus. It may be an etching apparatus, for example. The structure of the load-lock system 1 will be described below in greater detail.

Denoted at 16 is a load-lock chamber (housing), which is a major component of the load-lock system 1, and it is a vacuum chamber. Denoted at 3 is a vacuum side gate valve that functions as an interface between the main chamber 2 and the load-lock chamber 16. As this gate valve 3 is opened, an opening is defined in the side of the wall of the load-lock chamber 16 through which a substrate can be conveyed. As the gate valve 3 is closed, the chamber can be gas-tightly closed. Denoted at 4 is an atmosphere side gate valve, and it serves to define an opening for conveyance of a substrate 10 between the load-lock chamber 16 and the atmosphere (or an ambience different from that of the exposure apparatus). When the gate valve 4 is opened, an opening is defined in the side wall of the load-lock chamber 16 through which the substrate 10 can be conveyed. When it is closed, on the other hand, the load-locking wall surface is gas-tightly closed to prevent the atmosphere from entering into the load-lock chamber 16.

Denoted at 5 is an exhaust pipe, which is connected to a vacuum pump 7 through an exhaust valve 6. Normally, the vacuum pump 7 is held in a driven state. As the exhaust valve 6 is opened, the inside of the load-lock chamber 16 is communicated with the vacuum pump 7, whereby the gas inside the load-lock chamber 16 is exhausted outwardly. Denoted at 8 is a gas supplying pipe for supply a gas into the load-lock chamber 16. There is a gas supply valve 9 for supply a gas and for stopping the gas supply. In this example, the tip end of the pipe 8 is open to the atmosphere, and the gas supplied into the load-lock chamber 16 is air. However, the pipe 8 may be connected to a gas supply line so that any desired gases appropriate to the working condition, such as dry air or dry nitrogen, for example, may be used. The pipe 8 serves to supply a gas (pressure) into the load-lock chamber 16 to turn the inside pressure back to the atmospheric pressure to thereby allow opening of the atmosphere side gate valve 4.

Denoted at 11 is a substrate table mounted inside the load-lock chamber, and this is a table on which a substrate 10 is loaded, inside the load-lock chamber 16. The substrate table 11 has three pins. Since the contact to the substrate 10 is limited to these three points, contamination of the substrate due to adhesion of particles can be suppressed to a lowest level. Denoted at 12 is a hot or heated gas intake valve, which is provided at the ceiling of the load-lock chamber 16. It functions to define an opening for supplying a heated atmosphere into the load-lock chamber 16. When the heated gas supply is to be stopped, the intake valve 12 is closed, and the chamber is gas-tightly closed. As will be described later, the opening of the intake valve 12 should be wide enough to prevent it from interfering with the flow of gas generated by a fan 14. To this end, the intake valve 12 should desirably have a similar structure as that of the gate valve used for loading/unloading the substrate 10. However, a butterfly valve may be used therefor. Disposed above the intake valve 12 is a filter 13. Above the filter 13, there are a fan 14 and a heater 15. The top of the heater 15 is open to the atmosphere. Thus, atmospheric air is introduced from the outside in response to the operation of the fan 14, and it is heated by the heater 15. The heated air flows through the filter 13, and it flows into the load-lock chamber 16. The filter 13 is provided to prevent any particles from entering into the load-lock chamber 16.

The operation of the load-lock system will now be explained below, in sequence.

Figure 2A:
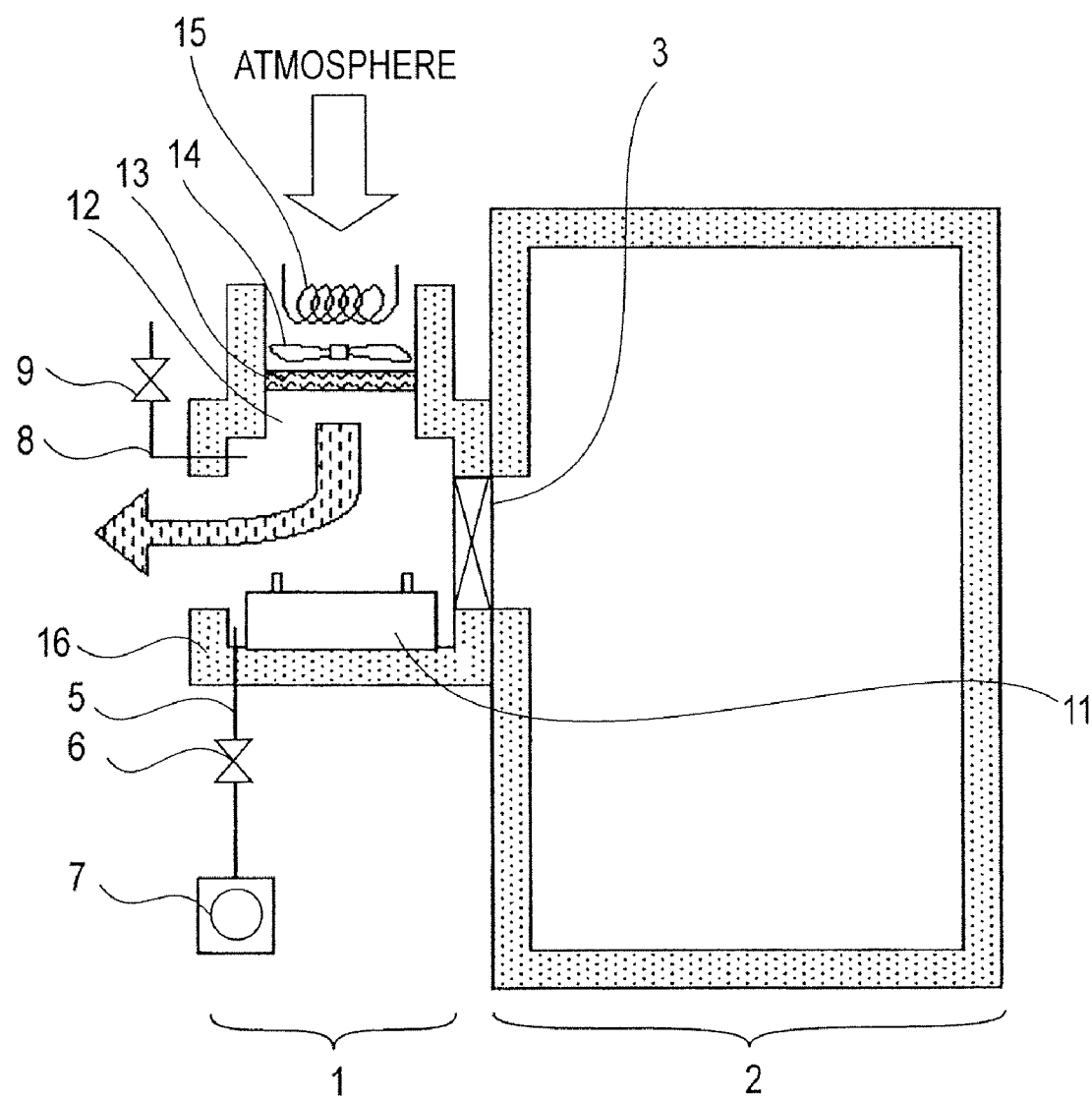
FIG. 2A is a schematic view for explaining a state in which a heated gas is blown, in the first embodiment of the present invention.
Figure 2B:
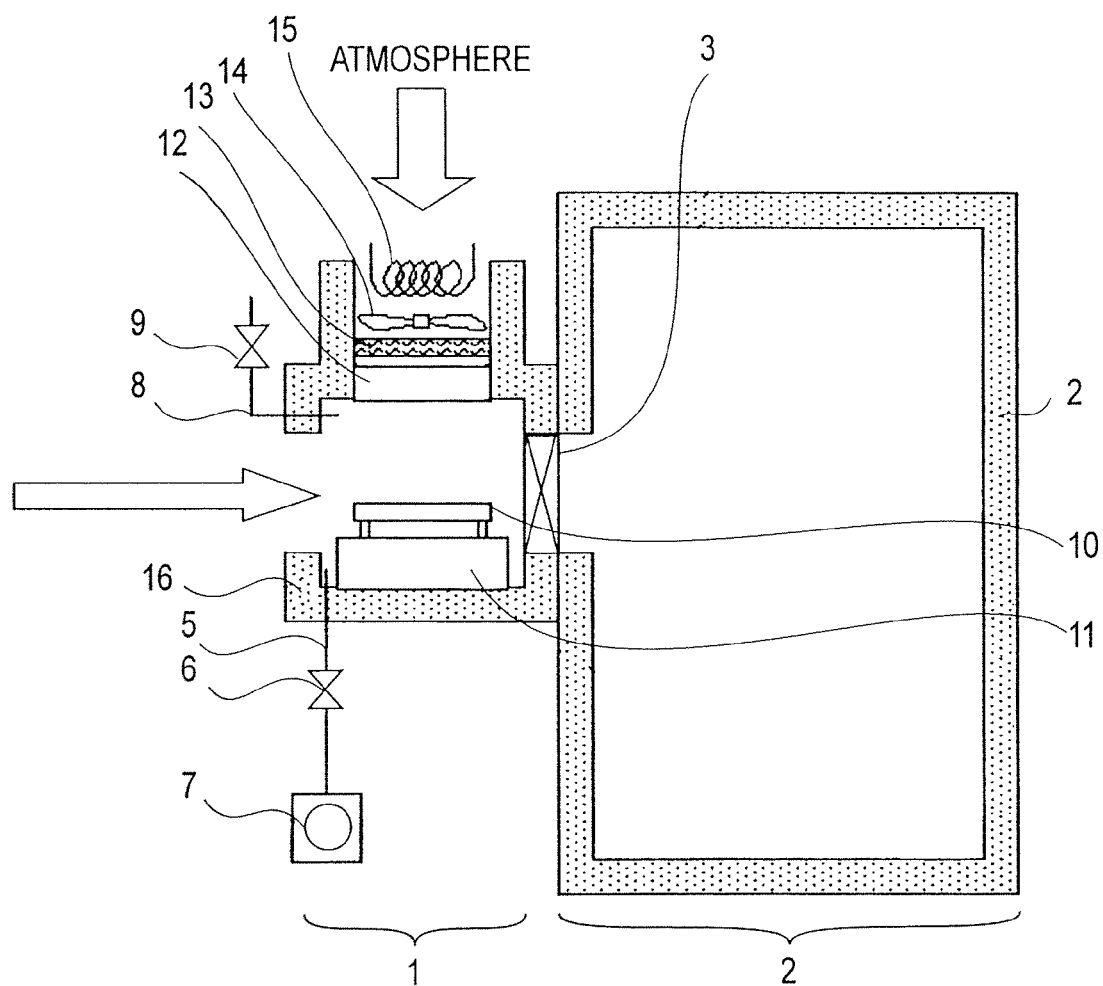
FIG. 2B is a schematic view for explaining a state in which a substrate is placed inside the load-lock chamber, in the first embodiment of the present invention.

FIG. 2A illustrates a state in which the atmosphere side gate valve of the load-lock system is open. In this state, the load-lock system stands by during loading of the substrate from the atmosphere side. Here, the heated gas intake valve 12 is held open, and the fan 14 is being driven. The heater 15 is being energized, such that atmospheric air heated to a high temperature by the heater 15 is flowing into the load-lock chamber 16 from the ceiling of the load-lock chamber 16. The heated atmospheric air flows outwardly through the opening of the atmosphere side gate valve 4. Just before the substrate 10 being introduced into the load-lock chamber 16, the fan 14 and the heater 15 are stopped, and the heated gas intake valve 12 is closed as well. By means of a conveyance robot (not shown), disposed in the atmosphere, the substrate 10 is loaded into the load-lock chamber 16 and is placed on the substrate table 11. FIG. 2B illustrates this stage.

After this, the atmosphere side gate valve 4 is closed and, subsequently, the exhaust valve 6 is opened, whereby the inside of the load-lock chamber 16 is evacuated.

Generally, if evacuation is carried rapidly from the state of normal temperature and atmospheric pressure, due to adiabatic expansion of the air, the moisture content contained in the air is frozen and falls as water drops onto the substrate, causing contamination of the substrate. Furthermore, heat is carried away from the substrate to cause a temperature decrease and, thus, contraction of the substrate. This adversely affects the registration precision in the exposure apparatus (exposure chamber 2), or it necessitates time-consuming temperature adjustment of the substrate in the exposure apparatus. In consideration of this, in conventional load-lock systems, the opening degree of the exhaust valve has to be controlled to perform the vacuum exhausting slowly. In the load-lock system 1 of this embodiment, as compared therewith, there is no such necessity, and the exhausting can be done at a high speed. This is because, by supplying air heated to a high temperature from the outside when the load-lock chamber 16 is open to the atmosphere, the gas (air) originally contained inside the chamber is replaced by the high-temperature gas, and because the temperature of the chamber inner wall is raised by the heated air, such that, even by rapid vacuum evacuation, the gas temperature does not decrease to the temperature that causes freezing of the moisture content. If desired, the fan 14, the heater 15 and/or the heated gas intake valve 12, for example, may be controlled so that the substrate temperature is maintained at a temperature suited for the process to be carried out inside the exposure apparatus (exposure chamber 2).

Figure 2C:
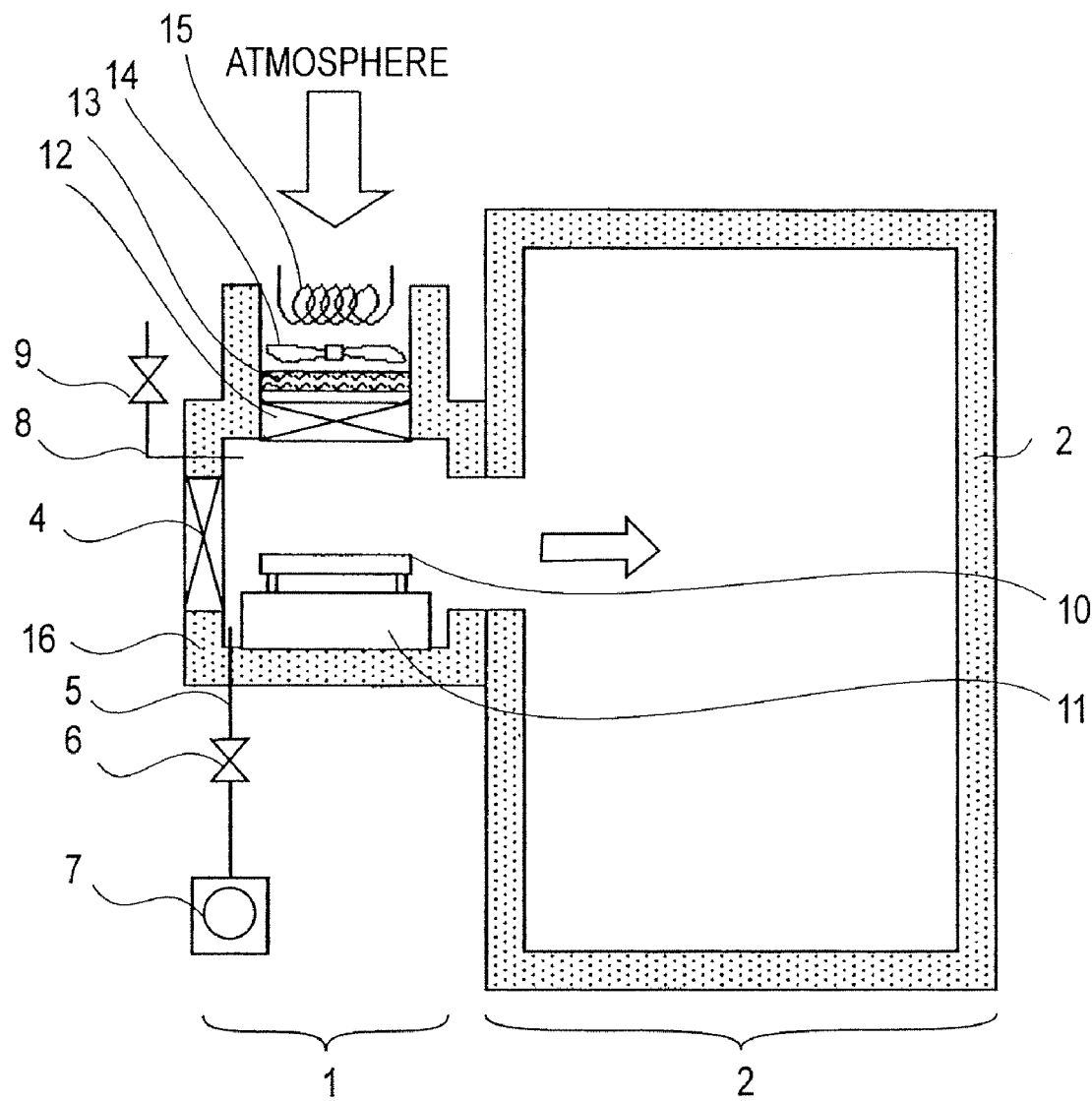
FIG. 2C is a schematic view for explaining a stage in which a vacuum side gate valve is opened, in the first embodiment of the present invention.
Figure 2D:
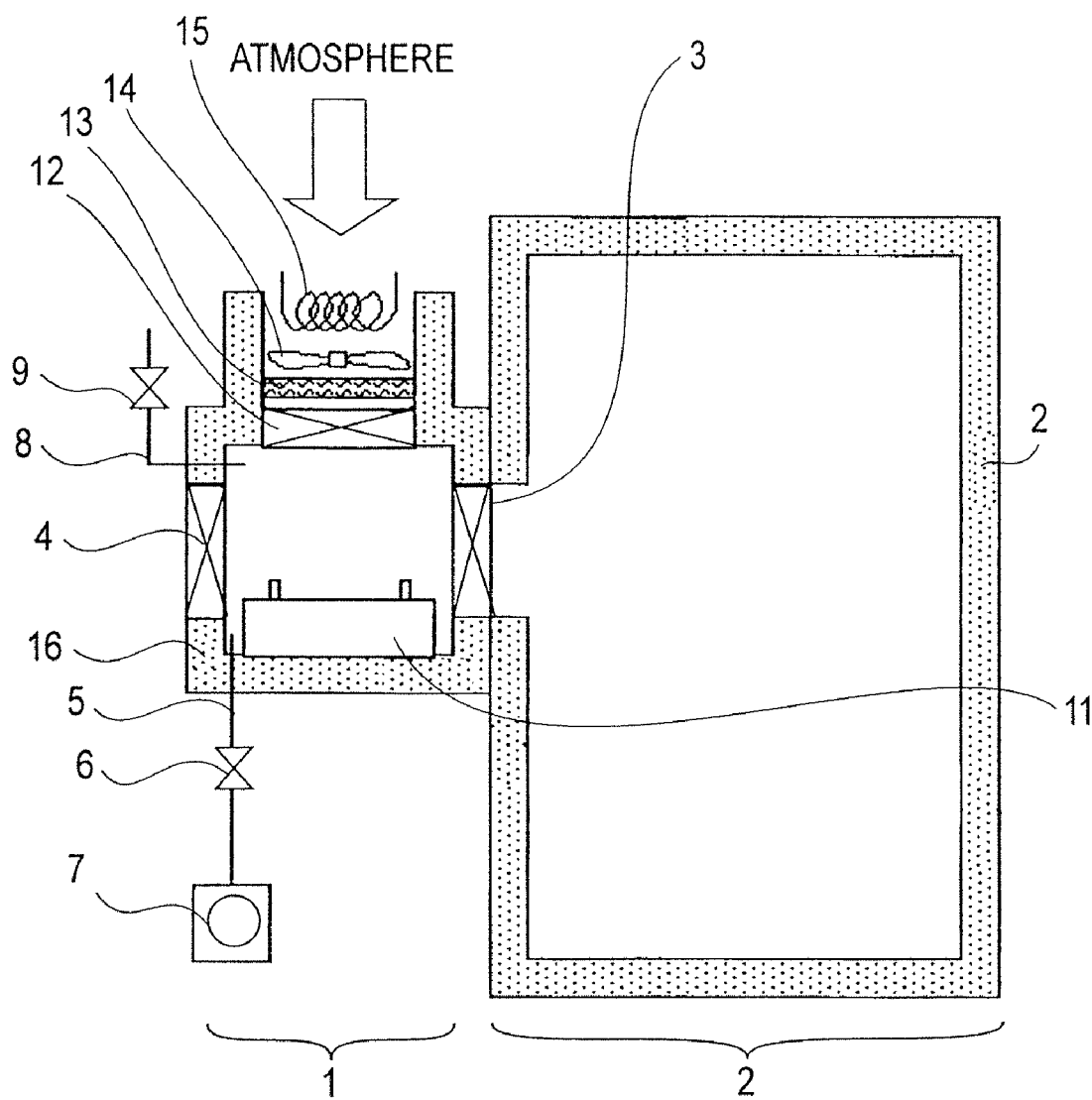
FIG. 2D is a schematic view for explaining a state in which conveyance of the substrate has been completed, in the first embodiment of the present invention.

By monitoring the vacuum level by use of a vacuum gauge disposed inside the load-lock chamber 16, whether vacuum evacuation has been completed or not is checked. If a predetermined vacuum level is reached, the exhaust valve 6 is closed and vacuum evacuation is discontinued. After this, the vacuum side gate valve 13 is opened, such that, as shown in FIG. 2C, the main chamber 2 and the load-lock chamber 15 are communicated with each other. There is a conveyance robot (not shown) provided inside the main chamber 2, that operates to convey the substrate 10 into the main chamber. After this, the vacuum side gate valve 3 is closed, as shown in FIG. 2D.

With the procedure described above, the sequence for loading the substrate 10 into the main chamber 2 from the atmosphere side is completed.

The sequence for unloading the substrate 10 from the main chamber 2 may be essentially the same as that in a conventional load-lock system, and a description thereof will be omitted here.

Embodiment 2

Figure 3:
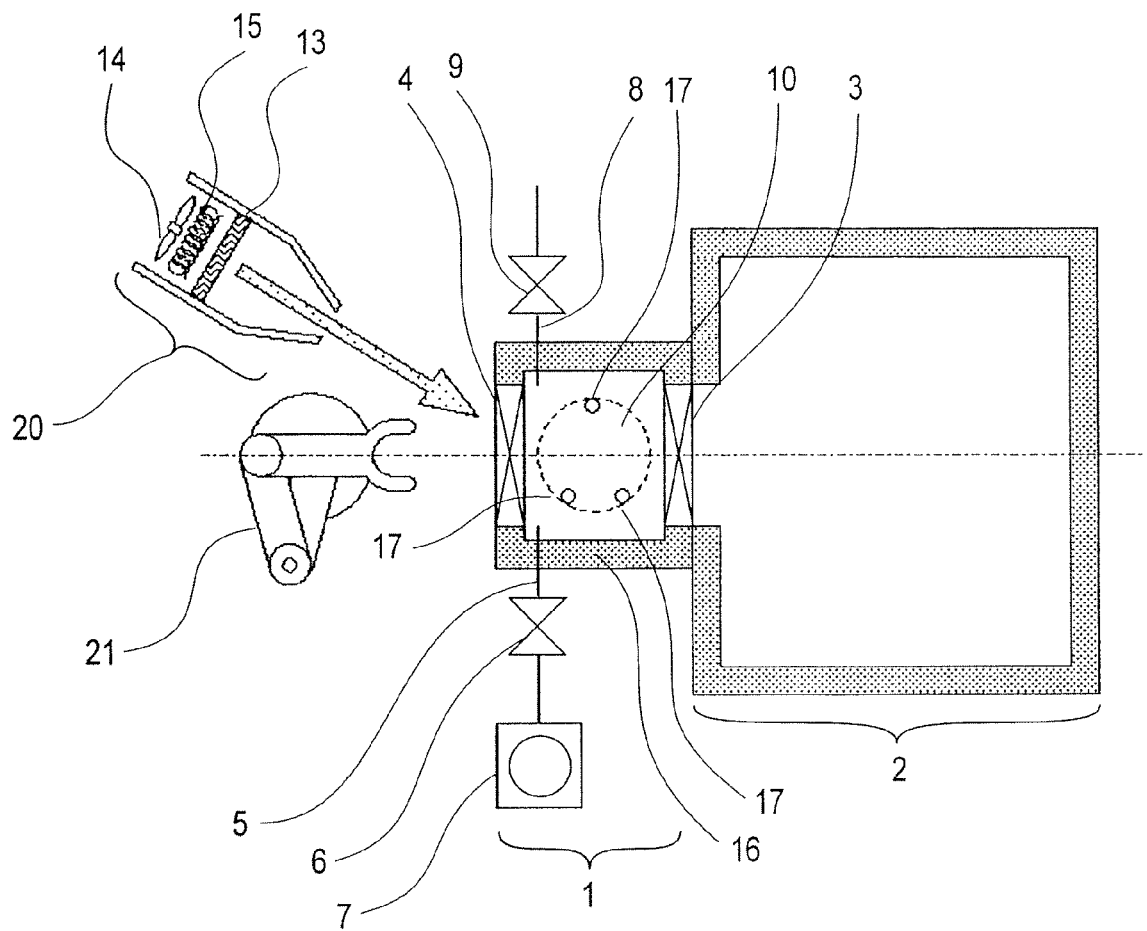
FIG. 3 is a schematic view for explaining a load-lock system according to a second embodiment of the present invention.

FIG. 3 illustrates a load-lock system according to a second embodiment of the present invention. The second embodiment is applied to an exposure apparatus, such as an EUV (extreme ultraviolet) exposure apparatus, wherein exposure is carried out in a vacuum ambience or a particular ambience, such as reduced pressure He. FIG. 3 is a plan view of the exposure apparatus, as seen from above. Structural components having similar functions as those of the first embodiment are denoted by corresponding reference numerals. Denoted in the drawing at 1 is the load-lock system, and denoted at 2 is a main chamber that defines a place where the exposure process is to be carried out.

Denoted at 16 is a load-lock chamber, which is a major component of the load-lock system 1. Denoted at 3 is a vacuum side gate valve, and denoted at 4 is an atmosphere side gate valve. These valves function to define an opening for passage of a substrate 10 between the load-lock chamber 16 and the main chamber 2 or between the atmosphere and the load-lock chamber 12, or to gas-tightly close the chamber.

Denoted at 5 is an exhaust pipe, and denoted at 7 is a vacuum pump, for exhausting the load-lock chamber 16. Denoted at 8 is a gas supply pipe, and denoted at 9 is a gas supply valve. The pipe 8 and the valve 9 serve to turn the inside pressure of the load-lock chamber 16 back to the atmospheric pressure, from the vacuum level. The gas supplied is air. However, the gas supplying pipe 8 may be connected to a gas supply line so that dry air or dry nitrogen, for example, may be supplied.

Denoted in the drawing at 10 is a substrate, which is a subject to be conveyed into the main chamber 12 and to be exposed there. Denoted at 17 are pins provided at three locations in the load-lock system 1, and a substrate is placed on these pins. Such a pin structure is used to decrease the contact area with the substrate to thereby reduce adhesion of particles to the bottom face of the substrate. Denoted at 20 is a hot air generator, which operates to intake an outside gas (air) and to blow it outwardly after heating the same. As will be described later, this hot air generator serves to blow air heated to a high temperature toward the load-lock system 1. Inside the generator 20, there are a fan 14, a heater 15 and a filter 13. By rotation of the fan 14, a flow of air is generated, and the air is then heated by the heater to a high temperature. The heated air flows through the filter 13, and then, the air is discharged outwardly from a blower outlet port of the generator 20. The blower outlet port of the generator 20 is set at such an angle that the heated air can be blown into the load-lock chamber 16.

Denoted at 21 is a conveyance robot in the atmosphere, and it functions to convey a substrate to the load-lock system from outside the apparatus.

The operation of the load-lock system of this embodiment will be explained in sequence.

The sequence for loading a substrate into the main chamber 2 is as follows.

Figure 4A:
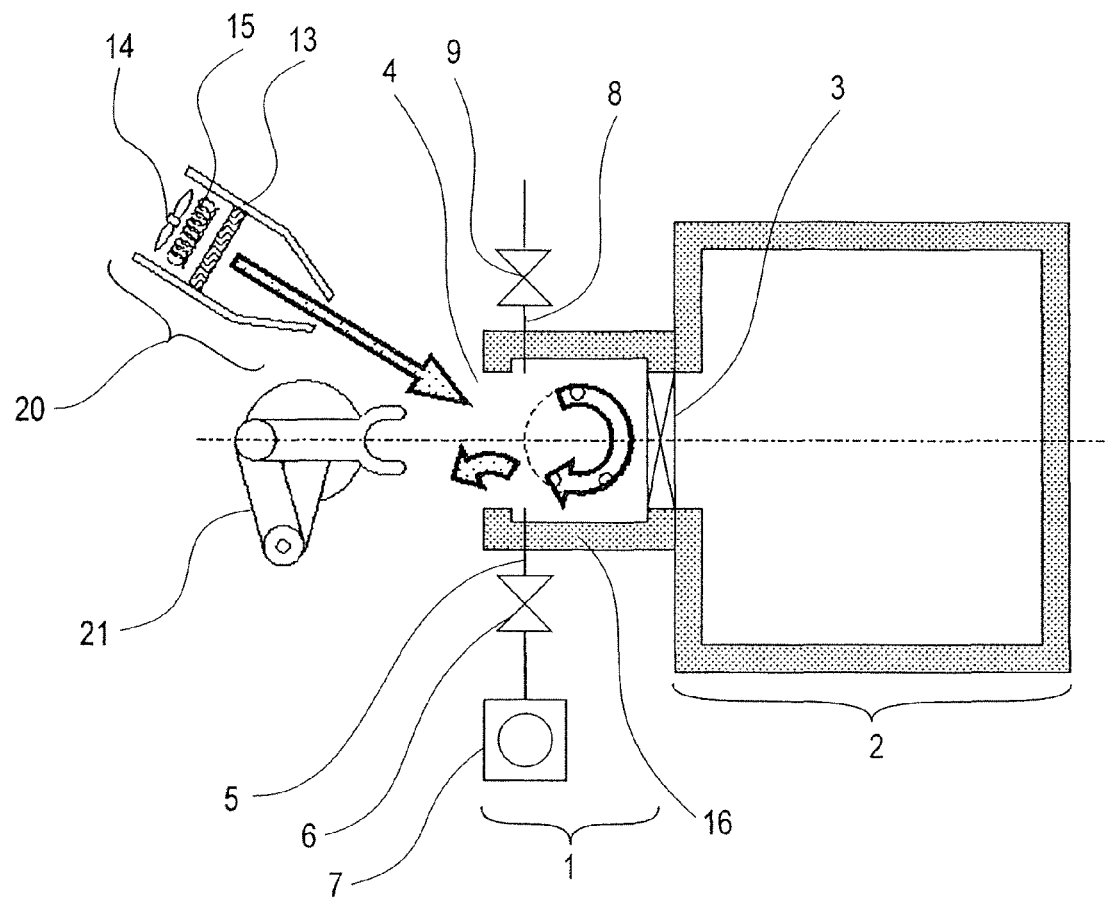
FIG. 4A is a schematic view for explaining a state in which a heated gas is blown, in the second embodiment of the present invention.

Here, it is assumed that FIG. 3 shows the initial state. While the inside of the load-lock chamber 16 is kept at the atmospheric pressure, the atmosphere side gate valve 4 is opened. At the same time as the gate valve 4 is opened, the hot air generator 20 is energized to generate and to blow hot air toward the load-lock chamber 16. FIG. 4A shows this state.

The hot air generated from the generator 20 flows into the load-lock chamber 16 through the opening of the atmosphere side gate valve 4. Then, after being turned back inside the chamber, it flows outwardly of the chamber. Arrows in FIG. 4A illustrate the flow of heated air. The hot air pushes the air originally contained in the chamber 16, such that the inside of the chamber is replaced by high-temperature air. The hot air generator 20 includes a filter 13 as described above and, therefore, the amount of particles entering into the chamber is low.

Figure 4B:
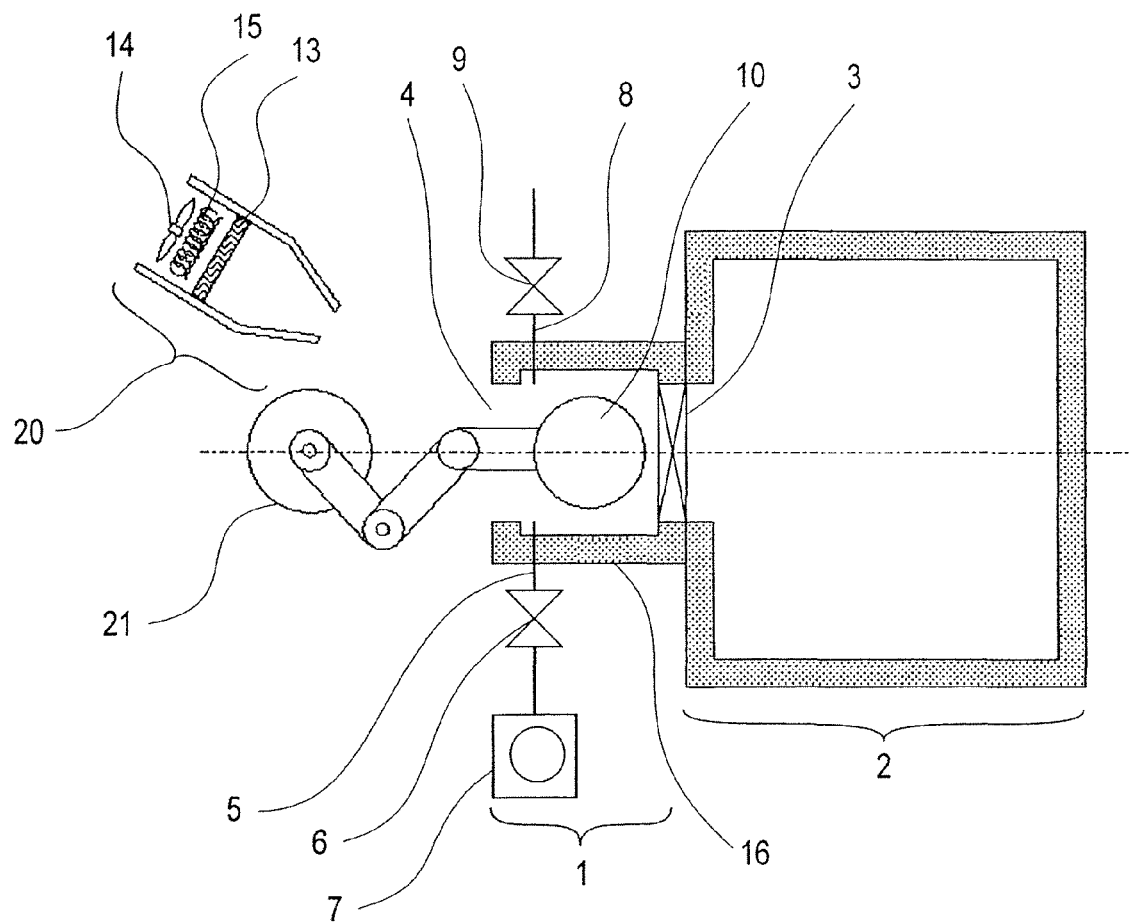
FIG. 4B is a schematic view for explaining a state in which a substrate is being loaded, in the second embodiment of the present invention.

Simultaneously, the substrate 10 is picked up from a substrate cassette, or the like, by means of the conveyance robot 21, and it is conveyed to the load-lock chamber 16. Just before the substrate 10 is loaded into the load-dock chamber 16 (before it moves across the flow of hot air), the operation of the hot air generator 20 is interrupted to stop the flow of hot air. Subsequently, the conveyance robot 21 places the substrate 10 on the pins 17 inside the load-lock chamber 6 (FIG. 4B). Then, the hand of the conveyance robot 21 is retracted and, thereafter, the atmosphere side gate valve 4 is closed.

Figure 4C:
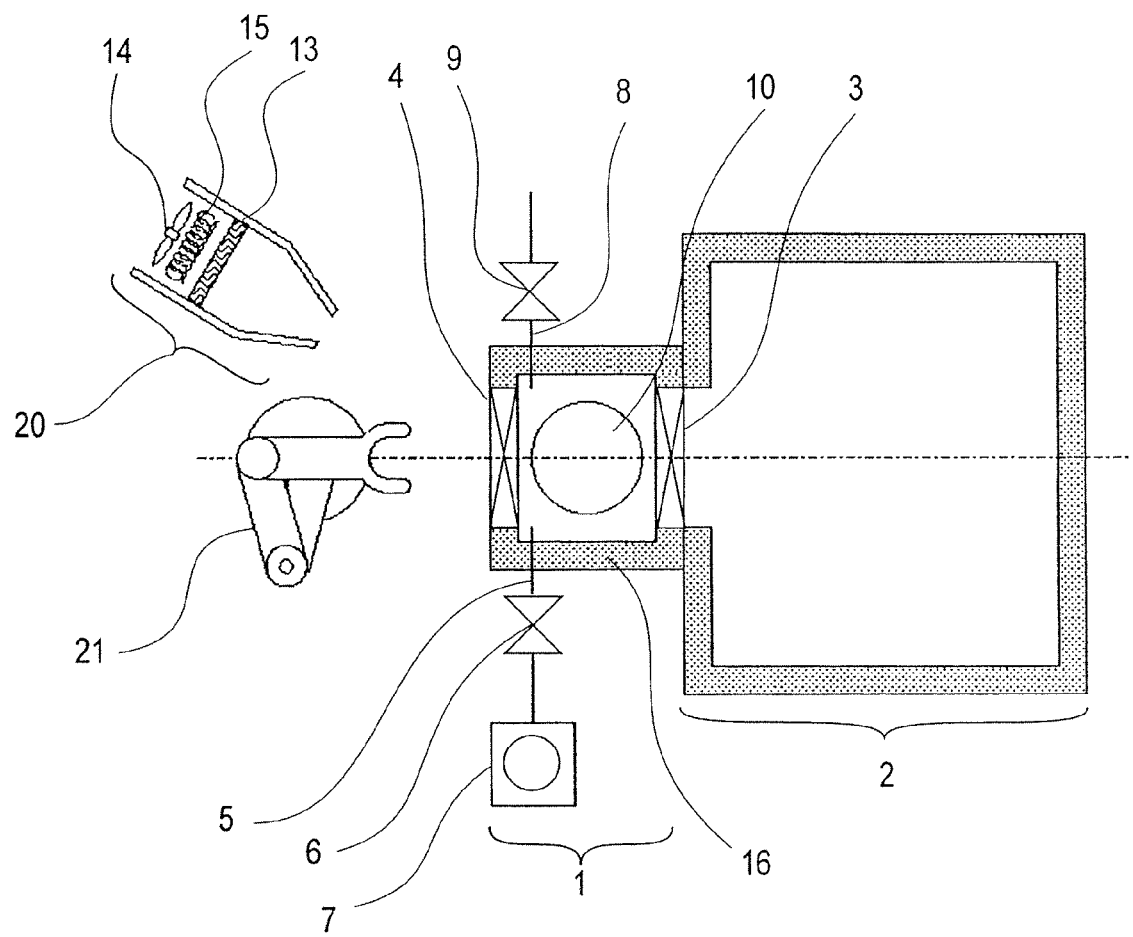
FIG. 4C is a schematic view for explaining a state in which vacuum evacuation is being carried out, in the second embodiment of the present invention.

After the gate valve 4 is closed, the exhaust valve 6 is opened, and air inside the load-lock chamber 16 is exhausted (FIG. 4C).

Generally, if vacuum evacuation is carried out rapidly from the state of normal temperature and atmospheric pressure, due to adiabatic expansion of the air, the moisture content contained in the air is frozen and falls as water drops onto the substrate, causing contamination of the substrate. Furthermore, heat is carried away from the substrate to cause a temperature decrease and, thus, contraction of the substrate. This adversely affects the registration precision in the exposure apparatus (exposure chamber 2), or it necessitates time-consuming temperature adjustment of the substrate in the exposure apparatus. In consideration of this, in conventional load-lock systems, the opening degree of the exhaust valve has to be controlled to perform the vacuum exhausting slowly. In the load-lock system 1 of this embodiment, as compared therewith, there is no such necessity, and the exhausting can be done at a high speed. This is because, by means of the hot air generator 20, air heated to a high temperature is supplied continuously, while the load-lock chamber 16 is kept opened to the atmosphere, the gas (air) originally contained inside the chamber is replaced by the high-temperature gas and because the temperature of the chamber inner wall is raised by the heated air, such that, even by rapid vacuum evacuation, the gas temperature does not decrease to the temperature that causes freezing of the moisture content and, additionally, a decrease of the substrate temperature is suppressed. If desired, the fan 14 and/or the heater 15, for example, may be controlled so that the substrate temperature is maintained at a temperature suited for the process to be carried out inside the exposure apparatus (exposure chamber 2).

Figure 4D:
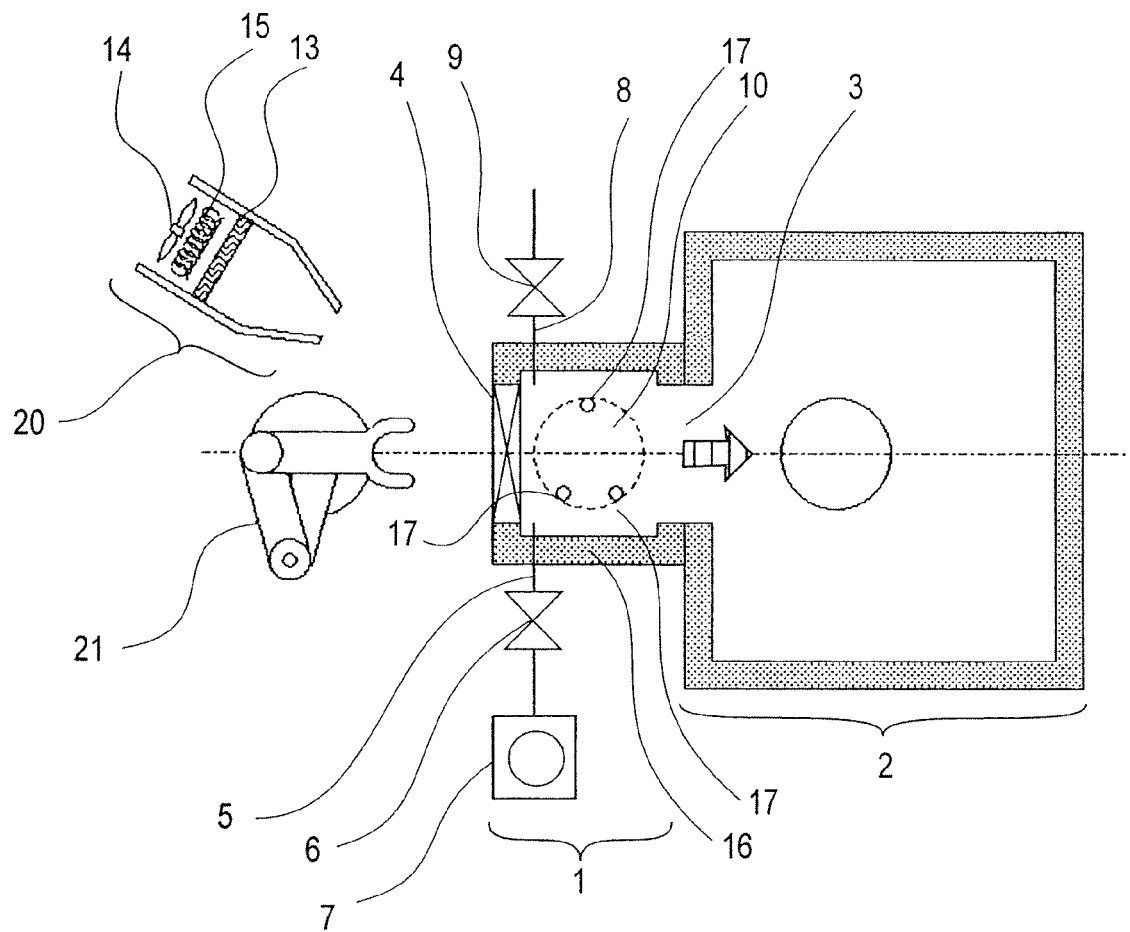
FIG. 4D is a schematic view for explaining a state in which the substrate is being loaded into the main chamber, in the second embodiment of the present invention.
Figure 5:
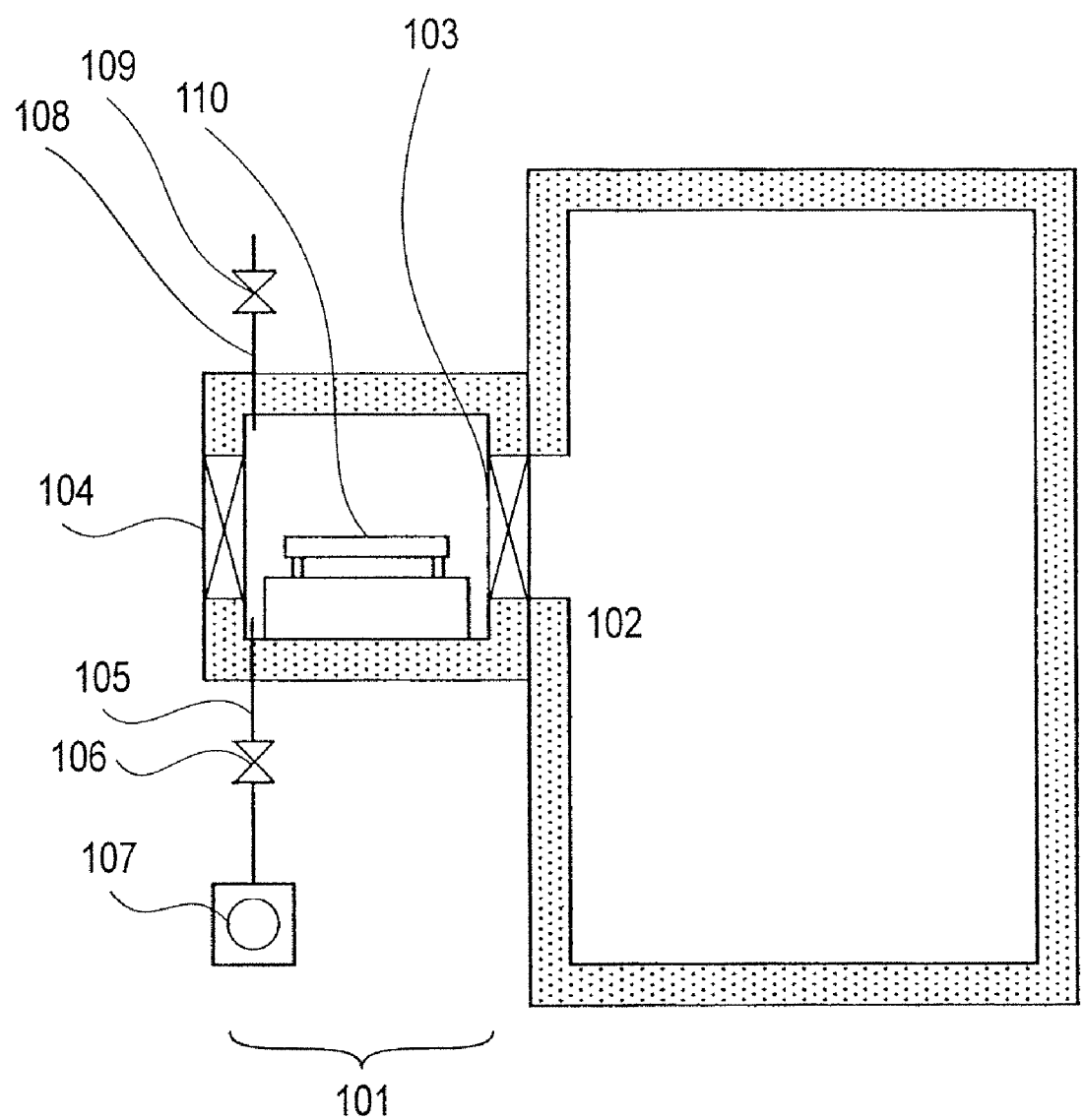
FIG. 5 is a schematic view of a known type load-lock system.

By monitoring the vacuum level by use of a vacuum gauge disposed inside the load-lock chamber 16, whether vacuum evacuation has been completed or not is checked. If a predetermined vacuum level is reached, the exhaust valve 6 is closed, and vacuum evacuation is discontinued. After this, the vacuum side gate valve 13 is opened, such that the main chamber 2 and the load-lock chamber 16 are communicated with each other. There is a conveyance robot (not shown) provided inside the main chamber 2, which operates to convey the substrate 10 into the main chamber (FIG. 4D).

After this, the vacuum side gate valve 3 is closed.

With the procedure described above, the sequence for loading the substrate 10 into the main chamber 2 from the atmosphere side is completed.

The sequence for unloading the substrate 10 from the main chamber 2 may be essentially the same as that in conventional load-lock systems.

As described, in accordance with the structure of this embodiment, a hot air generator 20 is added outside the load-lock system, by which a load-lock technique that enables high-speed exhausting, while reducing moisture content, freezing and substrate temperature decrease, is accomplished.

Figure 6:
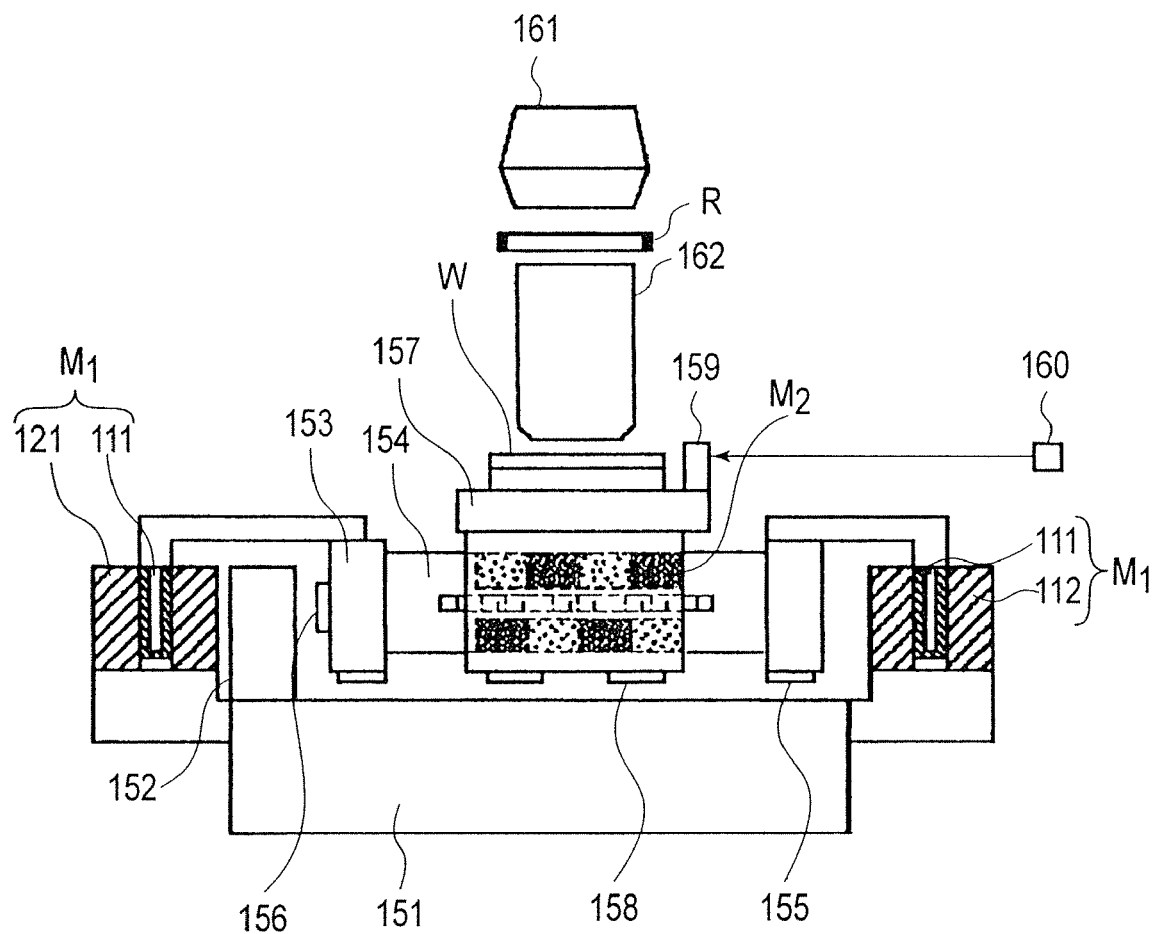
FIG. 6 is a schematic view showing an example of an exposure apparatus.

FIG. 6 shows an exposure apparatus for device manufacture, to which a load-lock system substrate as described hereinbefore can be applied.

This exposure apparatus is to be used for the manufacture of microdevices having a fine pattern formed thereon, such as semiconductor devices (semiconductor integrated circuits, for example), micromachines, or thin-film magnetic heads, for example. In this exposure apparatus, exposure light (which may include visible light, ultraviolet light, EUV light, X-rays, an electron beam, and a charged particle beam, for example) as exposure energy supplied from a light source 161 illuminates a reticle R (original), and light from the reticle R is projected onto a semiconductor wafer W (substrate) through a projection system having a projection lens 162 (which may include a refractive lens, a reflective lens, a catadioptric lens system, and a charged particle lens, for example), whereby a desired pattern is produced on the substrate.

The exposure apparatus includes a base table 151 having a guide 152 and a linear motor stator 121 fixed thereto. The linear motor stator 121 has a multiple-phase electromagnetic coil, while a linear motor movable element 111 concludes a permanent group. The linear motor movable element 111 is connected as a movable portion 153 to a movable guide 154 (stage), and through the drive of the linear motor M1, the movable guide 154 can be moved in a direction of a normal to the sheet of the drawing. The movable portion 153 is supported by a static bearing 155, taking the supper surface of the base table 151 as a reference, and, also, by a static bearing 156, taking the side surface of the guide 152 as a reference.

A movable stage 157, which is a stage member disposed to straddle the movable guide 154, is supported by a static bearing 158. This movable stage 157 is driven by a similar linear motor M2, so that the movable stage 157 moves leftwardly and rightwardly as viewed in the drawing, while taking the movable guide 154 as a reference. The motion of the movable stage 157 is measured by means of an interferometer 160 and a mirror 159, which is fixed to the movable stage 159.

A wafer (substrate) W is held on a chuck, which is mounted on the movable stage 157, and a pattern of the reticle R is transferred in a reduced scale onto different regions on the wafer W by means of the light source 161 and the projection optical system 162, in accordance with a step-and-repeat method or a step-and-scan method.

It should be noted that the load-lock system of the present invention can be similarly applied also to an exposure apparatus in which, without using a mask, a circuit pattern is directly drawn on a semiconductor wafer to expose a resist thereon.

Third Embodiment

Next, an embodiment of a device manufacturing method, which uses an exposure apparatus described above, will be explained.

Figure 7:
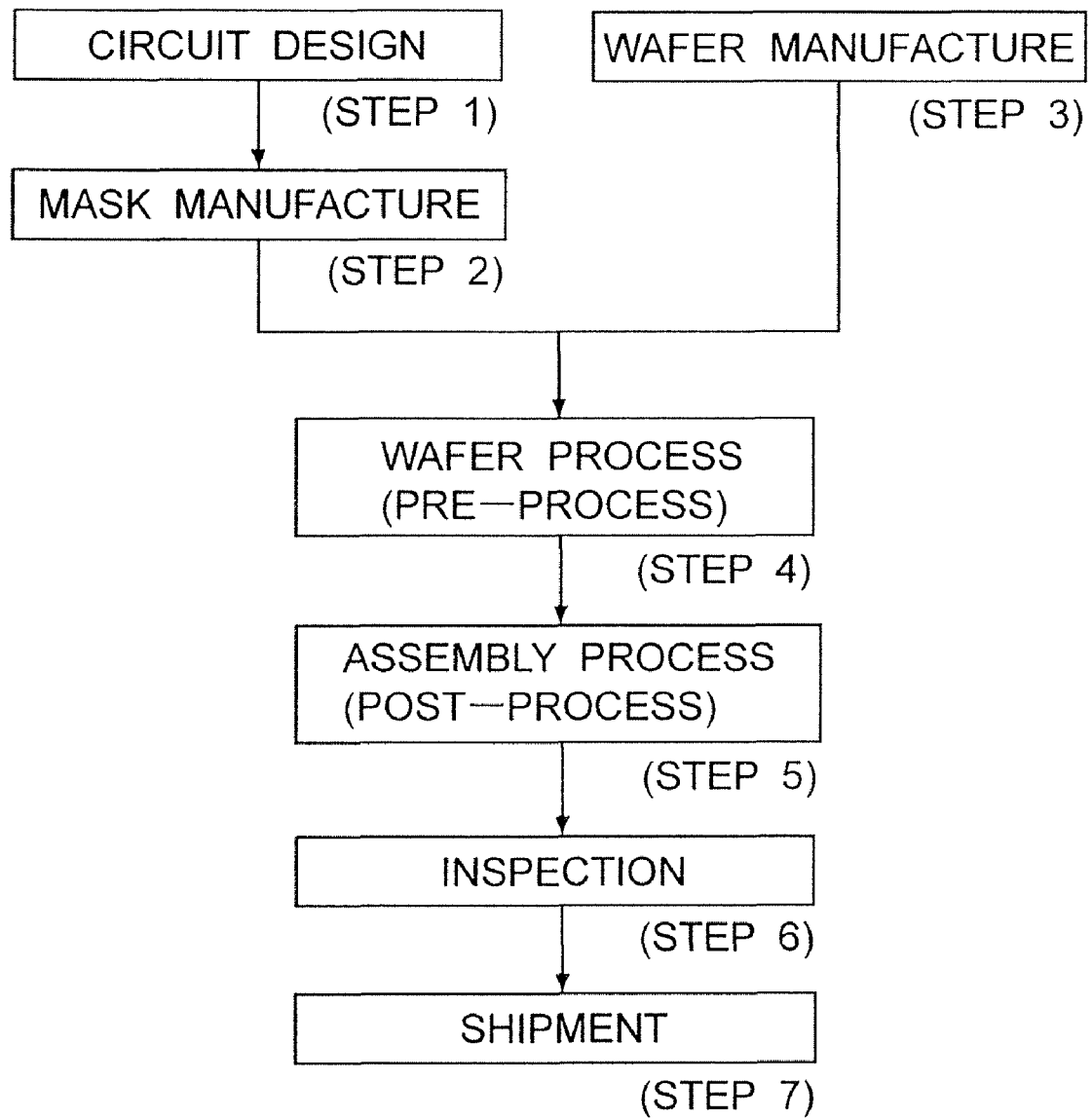
FIG. 7 is a flow chart for explaining the procedure of device manufacturing processes.

FIG. 7 is a flow chart for explaining the overall procedure for semiconductor manufacture. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process, which is called a pre-process, wherein, by using the thus prepared mask and wafer, a circuit is formed on the wafer in practice, in accordance with lithography. Step 5, subsequent to this, is an assembling step, which is called a post-process, wherein the wafer having been processed at step 4 is formed into semiconductor chips. This step includes an assembling (dicing and bonding) process and a packaging (chip sealing) process. Step 6 is an inspection step wherein an operation check, a durability check, and so on, for the semiconductor devices produced by step 5, are carried out. With these processes, semiconductor devices are produced, and they are shipped (step 7).

More specifically, the wafer process at step 4 described above includes (i) an oxidation process for oxidizing the surface of a wafer, (ii) a CVD process for forming an insulating film on the wafer surface, (iii) an electrode forming process for forming electrodes upon the wafer by vapor deposition, (iv) an ion implanting process for implanting ions to the wafer, (v) a resist process for applying a resist (photosensitive material) to the wafer, (vi) an exposure process for printing, by exposure, the circuit pattern of the mask on the wafer through the exposure apparatus described above, (vii) a developing process for developing the exposed wafer, (viii) an etching process for removing portions other than the developed resist image, and (ix) a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 2003-393670, filed Nov. 25, 2003, which is hereby incorporated by reference.

What is claimed is:

1. A method of exhausting a gas in a chamber of a load-lock system having (i) a first valve defining an opening for supplying a gas, (ii) a second valve defining an opening for conveyance of an article into the chamber from an outside atmosphere, and (iii) a fan for feeding the gas from outside of the chamber into the chamber, said method comprising:
a gas supplying step for supplying a gas that is heated by a heater into the chamber through the first valve, while the first valve and the second valve are kept open, to cause the heated gas to flow through the chamber toward the second valve by the fan, wherein the gas being supplied in the gas supplying step is the gas being fed from outside of the chamber by the fan, and being heated by the heater;
a conveying step, carried out after said gas supplying step is executed, for conveying the article into the chamber, while the second valve is kept open, and the heater and the fan are at rest, thus not feeding the gas heated by the heater into the chamber; and
an exhausting step, carried out after (i) said gas supplying step and said conveying step are executed and (ii) the first and second valves are closed, for exhausting the gas inside the chamber, while the first valve and the second valve are kept closed.

2. A method according to claim 1, wherein the first valve is provided at a ceiling of the chamber and the second valve is provided at a side wall of the chamber, and said gas supplying step causes the heated gas to flow from the ceiling of the chamber to a wall of the chamber and to the side wall of the chamber.

3. A method according to claim 2, wherein the chamber includes a wall that is different from a wall that is provided with the second valve, the different wall being provided with a third valve, and
wherein the second valve is an atmospheric side gate valve that allows communication between an inside of the chamber and the outside atmosphere, and the third valve is a vacuum side gate valve that allows communication between the inside of the chamber and a vacuum environment.

4. A method according to claim 1, wherein said gas supplying step comprises:
(i) feeding the gas into the chamber from outside of the chamber, while the first valve and the second valve are kept open;
(ii) heating the gas by the heater;
(iii) feeding the gas heated by the heater into the chamber through a filter and the first valve; and
(iv) feeding the gas into the chamber out of the chamber through the second valve by the fan.

5. A method of exhausting a gas in a chamber of a load-lock system having a valve defining an opening for supplying a gas and conveyance of an article, said method comprising:
a gas supplying step for supplying a gas that is heated by a heater into the chamber while the valve is kept open, wherein the gas being supplied in the gas supplying step is the gas being fed from outside of the chamber by a fan, and being heated by the heater;

a conveying step, carried out after said gas supplying step is executed, for conveying the article into the chamber while the valve is kept open, and the heater and the fan are at rest, thus not feeding the gas heated by the heater into the chamber; and an exhausting step, carried out after (i) said gas supplying step and said conveying step are executed and (ii) the valve is closed, for exhausting the gas inside the chamber while the valve is kept closed.

* * * * *